(12) United States Patent
Wang et al.

(10) Patent No.: US 10,014,418 B2
(45) Date of Patent: *Jul. 3, 2018

(54) CONDUCTIVE THICK FILM PASTE FOR SOLAR CELL CONTACTS

(71) Applicant: Heraeus Precious Metals North America Conshohocken LLC, West Conshohocken, PA (US)

(72) Inventors: Lei Wang, Conshohocken, PA (US); Matthias Hörteis, Hanau (DE); Weiming Zhang, Blue Bell, PA (US)

(73) Assignee: Heraeus Precious Metals North America Conshohocken LLC, West Conshohocken, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/258,248

(22) Filed: Sep. 7, 2016

(65) Prior Publication Data

US 2016/0380129 A1 Dec. 29, 2016
US 2017/0301803 A9 Oct. 19, 2017

Related U.S. Application Data

(62) Division of application No. 13/864,331, filed on Apr. 17, 2013.

(60) Provisional application No. 61/625,383, filed on Apr. 17, 2012.

(51) Int. Cl.

| | |
|---|---|
| C03C 8/10 | (2006.01) |
| C03C 8/18 | (2006.01) |
| H01B 1/16 | (2006.01) |
| H01L 31/0224 | (2006.01) |
| C03C 8/14 | (2006.01) |
| H01L 31/068 | (2012.01) |
| H01L 31/05 | (2014.01) |
| H01L 31/028 | (2006.01) |
| C09D 5/24 | (2006.01) |
| H01B 1/22 | (2006.01) |
| H01B 1/20 | (2006.01) |

(52) U.S. Cl.
CPC ........ *H01L 31/022425* (2013.01); *C03C 8/10* (2013.01); *C03C 8/14* (2013.01); *C03C 8/18* (2013.01); *C09D 5/24* (2013.01); *H01B 1/16* (2013.01); *H01B 1/22* (2013.01); *H01L 31/028* (2013.01); *H01L 31/05* (2013.01); *H01L 31/068* (2013.01); *H01B 1/20* (2013.01); *Y02E 10/547* (2013.01)

(58) Field of Classification Search
CPC .... C03C 3/18; C03C 3/10; C03C 8/10; C03C 8/18; H01B 1/16; H01L 31/022425
See application file for complete search history.

(56) References Cited

U.S. PATENT DOCUMENTS

| | | |
|---|---|---|
| 4,945,071 A | 7/1990 | Friesen et al. |
| 5,136,351 A | 8/1992 | Inoue et al. |
| 5,282,902 A | 2/1994 | Matsuyama |
| 5,378,408 A | 1/1995 | Carroll et al. |
| 5,957,828 A | 9/1999 | Hayashi |
| 6,071,437 A | 6/2000 | Oya |
| 6,086,790 A | 7/2000 | Hayashi et al. |
| 6,117,366 A | 9/2000 | Park et al. |
| 6,136,228 A | 10/2000 | Hirai et al. |
| 6,366,333 B1 | 4/2002 | Yamamoto et al. |
| 6,451,433 B1 | 9/2002 | Oka et al. |
| 7,940,447 B2 | 5/2011 | Wu et al. |
| 8,497,420 B2 | 7/2013 | Carroll et al. |
| 8,808,581 B2 | 8/2014 | Vernooy et al. |
| 8,845,932 B2 | 9/2014 | Hang et al. |
| 8,852,465 B2 | 10/2014 | Nakayama et al. |
| 8,895,843 B2 * | 11/2014 | Carroll .................. B22F 1/0059 136/256 |
| 8,952,245 B2 * | 2/2015 | Wang ............. H01L 31/022425 136/252 |

(Continued)

FOREIGN PATENT DOCUMENTS

| | | |
|---|---|---|
| CN | 101271928 A | 9/2008 |
| CN | 101630695 A | 1/2010 |

(Continued)

OTHER PUBLICATIONS

Chowdari, B.V.R., et al., "Synthesis and characterization of silver borotellurite glasses", Solid State Ionics, North Holland Pub. Company, vol. 86-88, pp. 521-526.

(Continued)

*Primary Examiner* — Karl E Group
(74) *Attorney, Agent, or Firm* — Blank Rome LLP; Charles R. Wolfe, Jr.; Cole T. Duncan

(57) ABSTRACT

The present invention relates to an inorganic reaction system used in the manufacture of electroconductive pastes. The inorganic reaction system comprises a lead containing matrix forming composition and a tellurium oxide additive. Preferably the lead containing matrix forming composition is between 5-95 wt. % of the inorganic reaction system, and the tellurium oxide additive is between 5-95 wt. % of the inorganic reaction system. The lead containing matrix forming composition may be a glass frit, and may comprise lead oxide. Another aspect of the present invention relates to an electroconductive paste composition that comprises metallic particles, an inorganic reaction system as previously disclosed, and an organic vehicle. Another aspect of the present invention relates to an organic vehicle that comprises one or more of a binder, a surfactant, a solvent, and a thixatropic agent. Another aspect of the present invention relates to a solar cell printed with an electroconductive paste composition as disclosed, as well as an assembled solar cell module. Another aspect of the present invention relates to a method of producing a solar cell.

21 Claims, No Drawings

(56) References Cited

U.S. PATENT DOCUMENTS

| | | | |
|---|---|---|---|
| 9,029,692 B2* | 5/2015 | Wang | H01L 31/0264 |
| | | | 136/252 |
| 9,257,578 B2* | 2/2016 | Wang | H01L 31/0264 |
| 2004/0046154 A1 | 3/2004 | McVicker et al. | |
| 2004/0259007 A1 | 12/2004 | Takahashi et al. | |
| 2005/0116203 A1 | 6/2005 | Takahashi et al. | |
| 2006/0073667 A1 | 4/2006 | Li et al. | |
| 2006/0231801 A1 | 10/2006 | Carroll et al. | |
| 2008/0063874 A1 | 3/2008 | Rakow et al. | |
| 2008/0134936 A1 | 6/2008 | Kamikoriyama et al. | |
| 2009/0053469 A1 | 2/2009 | Sato et al. | |
| 2009/0250106 A1 | 10/2009 | Hayashi et al. | |
| 2010/0096002 A1 | 4/2010 | Hayashi et al. | |
| 2010/0244205 A1 | 9/2010 | Prunchak | |
| 2011/0232746 A1* | 9/2011 | Carroll | B22F 1/0059 |
| | | | 136/256 |
| 2011/0232747 A1* | 9/2011 | Mikeska | B22F 1/0059 |
| | | | 136/256 |
| 2012/0031484 A1 | 2/2012 | Matsuno et al. | |
| 2013/0099179 A1 | 4/2013 | Vanheusden et al. | |

FOREIGN PATENT DOCUMENTS

| | | |
|---|---|---|
| CN | 102117844 A | 7/2011 |
| CN | 102376379 A | 3/2012 |
| EP | 1713082 A1 | 10/2006 |
| EP | 2317523 A1 | 5/2011 |
| EP | 2317561 A2 | 5/2011 |
| EP | 2323171 A1 | 5/2011 |
| EP | 2590177 A2 | 5/2013 |
| JP | H05 128910 A | 5/1993 |
| JP | 2007294677 A | 11/2007 |
| JP | 2008 251324 A | 10/2008 |
| JP | 2009099781 A | 5/2009 |
| JP | 2011 082211 A | 4/2011 |
| JP | 2011181680 A | 9/2011 |
| JP | 2011204872 A | 10/2011 |
| WO | WO-9200925 A1 | 1/1992 |
| WO | WO-2011/060341 A1 | 5/2011 |
| WO | WO-2011140189 A1 | 11/2011 |

OTHER PUBLICATIONS

Kassab Luciana et al., "Enhanced luminescence of Tb3+/Eu3+ doped tellurium oxide glass containing silver nanostructures", Journal of Applied Physics, American Institutes of Physics, New York, US, vol. 105(10), May 20, 2009, p. 103505.

G. El-Damrawi, "Silver ion transporting mechanism in superionic conducting Agi-Ag 2 0-Te0 2 glasses", Journal of Physics: Condensed Matter, vol. 11(33), Aug. 23, 1999, pp. 6385-6394.

* cited by examiner

CONDUCTIVE THICK FILM PASTE FOR SOLAR CELL CONTACTS

CROSS REFERENCE TO RELATED APPLICATION

This application is a divisional of U.S. application Ser. No. 13/864,331, filed Apr. 17, 2013, now abandoned, which claims the benefit of U.S. Provisional Patent Application No. 61/625.383, filed on Apr. 17, 2012. The disclosures of the above mentioned priority applications are hereby incorporated by reference in their entirety into the present disclosure.

FIELD OF THE INVENTION

The present invention relates to electroconductive pastes as utilized in solar panel technology. Specifically, in one aspect, the present invention relates to an inorganic reaction system for use in electroconductive pastes. Another aspect of the present invention relates to an electroconductive paste composition comprising a conductive metal component, an inorganic reaction system, and an organic vehicle. Another aspect of the present invention relates to a solar cell produced by applying an electroconductive paste, which comprises an electroconductive metal, an inorganic reaction system, and an organic vehicle, to a silicon wafer. Yet another aspect of the present invention relates to a solar cell module assembled using solar cells produced by applying an electroconductive paste to a silicon wafer, wherein the electroconductive paste comprises an electroconductive metal, an inorganic reaction system, and an organic vehicle.

BACKGROUND OF THE INVENTION

Solar cells are devices that convert the energy of light into electricity using the photovoltaic effect. Solar power is an attractive green energy source because it is sustainable and produces only non-polluting by-products. Accordingly, a great deal of research is currently being devoted to developing solar cells with enhanced efficiency while continuously lowering material and manufacturing costs. When light hits a solar cell, a fraction of the incident light is reflected by the surface and the remainder transmitted into the solar cell. The transmitted light/photons are absorbed by the solar cell, which is usually made of a semiconducting material, such as silicon. The absorbed photon energy excites electrons from the atoms of the semiconducting material, generating electron-hole pairs. These electron-hole pairs are then separated by p-n junctions and collected by conductive electrodes that are applied on the solar cell surface.

The most common solar cells are those based on silicon, more particularly, a p-n junction made from silicon by applying a dopant diffusion layer onto silicon substrate, coupled with two electrical contact layers or electrodes. In a p-type semiconductor, dopant atoms are added to the semiconductor in order to increase the number of free charge carriers (positive holes). Essentially, the doping material takes away weakly bound outer electrons from the semiconductor atoms. The purpose of p-type doping is to create an abundance of holes. In the case of silicon, a trivalent atom is substituted into the crystal lattice. One example of a p-type semiconductor is silicon with a boron or aluminum dopant. Solar cells can also be made from n-type semiconductors. In an n-type semiconductor, the dopant atoms provide extra electrons to the host substrate, creating an excess of negative electron charge carriers. Doping atoms, donors, usually have one more valence electron than one type of the host atoms. The most common example is atomic substitution in group IV solids (silicon, germanium, tin) which contain four valence electrons by group V elements (phosphorus, arsenic, antimony) which contain five loosely bound valence electrons. One example of an n-type semiconductor is silicon with a phosphorous dopant.

In order to minimize reflection of the sunlight by the solar cell, an antireflection coating (ARC), such as silicon nitride ($SiN_x$), silicon oxide ($SiO_2$), alumina oxide ($Al_2O_3$), or titanium oxide ($TiO_2$), is applied to the n-type or p-type diffusion layer to increase the amount of light absorbed into the solar cell. The ARC is typically non-conductive, and may also passivate the surface of the silicon substrate.

For silicon solar cell metallization processes, a rear contact is typically first applied to the silicon substrate. A typical process involves applying a back side silver paste or silver/aluminum paste to form soldering pads, followed by an aluminum paste applied to the entire back side of the substrate. Second, using an electroconductive paste, a metal contact may be screen printed onto the front side antireflection layer (after drying of the back side paste) to serve as a front electrode. This electrical contact layer on the front face or front of the cell, where light enters, is typically present in a grid pattern made of "finger lines" and "bus bars" rather than a complete layer because the metal grid materials are typically not transparent to light. The silicon substrate with printed front side and back side paste is then fired at a temperature of approximately 700-975° C. After firing, the front side paste etches through the ARC layer, forms electrical contact between the grid contacts and the semiconductor, and converts the metal pastes to metal electrodes on the light receiving surface of the solar cell. The back side paste is typically fired at the same time with the front side paste, and forms electrical contact with the backside of the silicon substrate. The resulting metallic electrodes allow electricity to flow to and from solar cells connected in a solar panel.

To assemble a solar module, multiple solar cells are connected in series and/or in parallel and the ends of the electrodes of the first cell and the last cell are preferably connected to output wiring. The solar cells are typically encapsulated in a transparent thermal plastic resin, such as silicon rubber or ethylene vinyl acetate. A transparent sheet of glass is placed on the front surface of the encapsulating transparent thermal plastic resin. A back protecting material, for example, a sheet of polyethylene terephthalate coated with a film of polyvinyl fluoride having good mechanical properties and good weather resistance, is placed under the encapsulating thermal plastic resin. These layered materials may be heated in an appropriate vacuum furnace to remove air, and then integrated into one body by heating and pressing. Furthermore, since solar cells are typically left in the open air for a long time, it is desirable to cover the circumference of the solar cell with a frame material consisting of aluminum or the like.

A typical electroconductive paste contains metallic particles, glass frit, and an organic vehicle. These components are usually selected to take full advantage of the theoretical potential of the resulting solar cell. For example, it is desirable to maximize the contact between the metallic paste and silicon surface, and the metallic particles themselves, so that the charge carriers can flow through the interface and finger lines to the bus bars. The glass particles in the composition etch through the antireflection coating layer upon firing, helping to build contact between the metal and the n+ type silicon. On the other hand, the glass must not be so aggressive that it shunts the p-n junction after firing. Thus, the goal is to minimize contact resistance while keeping the p-n junction intact so as to achieve improved efficiency. Known compositions have high contact resistance due to the insulating effect of the glass in the interface of the metallic layer and silicon wafer, as well as other disadvantages such as high recombination in the contact area. Further, glass frit is known to have wide melting temperature ranges, making their behavior strongly dependent on the processing parameters. Accordingly, electroconductive paste compositions with improved electrical properties are desirable.

U.S. Patent Application Publication No. 2011/0308595 A1 discloses a thick-film paste for printing on the front-side of a solar cell device having one or more insulating layers. The thick-film paste comprises an electrically conductive metal, and lead-tellurium-oxide dispersed in an organic medium. The lead-tellurium-oxide is present in an amount of 0.5 to 15 wt. % of solids of the paste and the molar ratio of lead to tellurium is between 5/95 and 95/5. The lead-tellurium-oxide (Pb—Te—O) is prepared by mixing $TeO_2$ and lead oxide powders, heating the powder mixture in air or an oxygen-containing atmosphere to form a melt, quenching the melt, grinding and ball-milling the quenched material, and screening the milled material to provide a powder with the desired particle size.

U.S. Pat. No. 5,066,621 discloses a sealing glass composition comprising, in wt. %, 13-50% lead oxide, 20-50% vanadium oxide, 2-40% tellurium oxide, up to 40% selenium oxide, up to 10% phosphorous oxide, up to 5% niobium oxide, up to 20% bismuth oxide, up to 5% copper oxide and up to 10% boron oxide and an electrically conductive formulation comprising, in wt. %, 50-77% silver, 8-34% of a sealing glass composition as described previously, 0.2-1.5% resin and thixotrope and 10-20% organic solvent. The '621 patent discloses tellurium oxide in a preferred range of 9-30 wt. %.

U.S. Patent Application Publication No. 2011/0192457 discloses an electroconductive paste containing an electroconductive particle, an organic binder, a solvent, a glass frit, and an organic compound including alkaline earth metal, a metal with a low melting point or a compound affiliated with a metal with a low melting point. The '457 publication teaches the use of lead-free glass frit, for example bismuth (Bi) containing glass frit and barium (Ba) containing glass frit.

U.S. Pat. Nos. 7,736,546 and 7,935,279 disclose lead-free glass frits with no intentionally added lead which comprise $TeO_2$ and one or more of $Bi_2O_3$, $SiO_2$ and combinations thereof. The patents also disclose conductive inks comprising the glass frits, and articles having such conductive inks applied. The $TeO_2$ is incorporated with the one or more of $Bi_2O_3$, $SiO_2$ in a lead-free glass matrix.

SUMMARY OF THE INVENTION

The present invention provides an inorganic reaction system for an electroconductive paste comprising a lead containing matrix forming composition and tellurium oxide additive, wherein the lead containing composition is between 5-95 wt. % of the inorganic reaction system, and the tellurium oxide additive is between 5-95 wt. % of the inorganic reaction system.

According to another aspect of the present invention, the inorganic reaction system comprises a lead containing matrix forming composition between 10-90 wt. % of the inorganic reaction system, and tellurium oxide additive between 10-60 wt. % of the inorganic reaction system.

According to a further aspect of the present invention, the tellurium oxide additive may be one or more tellurium dioxide, tellurium trioxide, and/or any tellurium compound that would convert to tellurium oxide at temperature 200-1000° C.

According to an additional aspect of the present invention, the tellurium oxide additive is of an average particle size of less than 10 µm. More preferably, the tellurium oxide additive is of an average particle size of less than 1 µm.

According to another aspect of the present invention, the lead containing matrix forming composition is a glass frit with an amorphous structure, and may also incorporate crystalline phases or compounds. According to another aspect of the invention, the lead containing matrix forming composition comprises lead oxide. According to yet another aspect of the invention, the lead containing matrix forming composition comprises between about 10-90 wt. %, preferably about 25-85 wt. %, lead oxide. In another embodiment, the lead containing composition is a low-lead composition comprising between about 5-45 wt. %, preferably about 10-15 wt. %, lead oxide.

According to one more aspect of the present invention, the inorganic reaction system has a PbO:Tellurium oxide additive weight percentage ratio of 95:5 to 5:95. Preferably, the inorganic reaction system has a PbO:Tellurium oxide additive weight percentage ratio of 10:1 to 1:10, and more preferably, the PbO:Tellurium oxide additive weight percentage ratio is 5:1 to 1:5.

The present invention also provides an electroconductive paste composition comprising metallic particles, an inorganic reaction system, and an organic vehicle.

According to one aspect of the present invention, the metallic particles in the electroconductive paste are at least one of silver, gold, copper, and nickel. According to another aspect of the present invention, the metallic particles in the electroconductive paste are silver. According to another aspect of the present invention, the metallic particles in the electroconductive paste comprise about 50-95 wt. % of the paste.

According to another aspect of the invention, the organic vehicle comprises one or more of a binder, a surfactant, an organic solvent, and a thixatropic agent. According to another aspect of the present invention, the binder may be present in about 1-10 wt. % of the organic vehicle and comprises at least one of ethylcellulose or phenolic resin, acrylic, polyvinyl butyral or polyester resin, polycarbonate, polyethylene or polyurethane resins, or rosin derivatives. The surfactant may be present in about 1-10 wt. % of the organic vehicle and comprises at least one of polyethyleneoxide, polyethyleneglycol, benzotriazole, poly(ethyleneglycol)acetic acid, lauric acid, oleic acid, capric acid, myristic acid, linolic acid, stearic acid, palmitic acid, stearate salts, palmitate salts, and mixtures thereof. The organic solvent may be present in about 50-90% wt. % of the organic vehicle and comprises at least one of carbitol, terpineol, hexyl carbitol, texanol, butyl carbitol, butyl carbitol acetate, dimethyladipate, or glycol ether. The thixatropic agent may be present in about 0.1-5 wt. % of the organic vehicle and comprises thixatropic agents known in the art.

The present invention further provides a solar cell produced by applying the electroconductive paste of the present invention to a silicon wafer and firing the silicon wafer. According to one aspect of the present invention, the silicon wafer is of sheet resistance above 60 Ω/□. According to another aspect of the present invention, the silicon wafer is of sheet resistance above 65 Ω/□. According to yet another aspect of the present invention, the silicon wafer is of sheet resistance above 70 Ω/□. According to a further aspect of the present invention, the silicon wafer is of sheet resistance above 90 Ω/□. According to an additional aspect of the present invention, the silicon wafer is of sheet resistance above 95 Ω/□.

The present invention further provides a solar cell module comprising electrically interconnected solar cells made with the electroconductive paste of the present invention.

The present invention further provides a method of producing a solar cell, comprising the steps of providing a silicon wafer, applying the electroconductive paste of the present invention to the silicon wafer, and firing the silicon wafer according to an appropriate profile.

According to an aspect of the present invention, the silicon wafer further comprises an antireflective coating. According to another aspect of the invention, the electroconductive paste of the present invention is applied to the light receiving surface of the silicon wafer.

DETAILED DESCRIPTION

The present invention relates to electroconductive paste compositions as used in the manufacturing of solar cells. Electroconductive pastes typically comprise metallic particles, glass frit (an amorphous or partially crystalline material), and an organic vehicle. While not limited to such an application, such pastes may be used to form an electrical contact layer or electrode on a solar cell. Specifically, the pastes may be applied to the front side of a solar cell or to the back side of a solar cell and provide the path by which conductivity occurs between cells.

One aspect of the present invention provides an inorganic reaction system (IRS). The IRS of the present invention provides a delivery media for the metallic particles, allowing them to migrate from the paste to the interface of the metal conductor and the semiconductor substrate. The IRS of the present invention also provides a reaction media for the paste components to undergo physical and chemical reactions at the interface. Physical reactions include, but are not limited to, melting, dissolving, diffusing, sintering, precipitating, and crystallizing. Chemical reactions include, but are not limited to, synthesis (forming new chemical bonds) and decomposition, reduction and oxidation, and phase transitioning. Lastly, the IRS of the present invention acts as an adhesion media that provides the bonding between the metal conductor and the semiconductor substrate, thereby securing reliable electrical contact performance during the lifetime of the solar device. Although intended to achieve the same effects, existing glass frit compositions can result in high contact resistance due to the insulating effect of the glass in the interface of the metallic layer and silicon wafer. The IRS of the present invention acts as a delivery, reaction, and adhesion media, but provides much lower contact resistance and higher overall cell efficiency.

More specifically, the IRS of the present invention provides improved Ohmic and Schottky contact between the metal conductor (e.g., silver) and the semiconductor emitter (e.g., silicon substrate) in the solar cell. The IRS of the present invention is a reactive media with respect to the silicon and creates active areas on the silicon emitter that improve overall contact mechanisms, such as through direct contact, or tunneling. The improved contact properties provide better Ohmic contact and Schottky contact, and therefore better overall solar cell performance.

The IRS of the present invention may comprise crystalline or partially crystalline materials. It may comprise various compounds including, but not limited to, oxides, salts, fluorides, and sulfides, as well as alloys, and elemental materials.

The preferred embodiment of the present invention relates to an IRS as used in an electroconductive paste that comprises a lead containing matrix forming composition and a tellurium oxide additive. The matrix forming composition fuses or sinters at the firing temperature of the present invention IRS and/or the electroconductive paste comprising an IRS according to the present invention. The matrix forming composition may be a glass, ceramic, or any compounds known to one skilled in the art that can form a matrix at elevated temperature. A preferred embodiment of the lead containing matrix forming composition is a lead containing glass frit. More preferably, a glass frit comprises lead oxide as a starting material. The lead containing matrix forming composition is between 5-95 wt. % of the IRS, more preferably between 25-60 wt. % of the IRS. Further, the lead containing matrix forming composition comprises about 5-95 wt. %, preferably about 10-90 wt. %, more preferably 25-85 wt. %, and even more preferably about 45-75 wt. %, lead oxide. In another embodiment, the lead matrix forming composition may contain a relatively low lead content, e.g., between about 5-45 wt. %, preferably about 10-40 wt. %, and more preferably about 10-15 wt. %, lead oxide.

Used in the context of the present invention, the term additive refers to a component of the IRS that is discrete, particularly not part of a matrix forming composition. An additive is provided directly to the IRS. In the preferred embodiment, where the lead containing matrix forming composition is a lead containing glass frit, the tellurium oxide additive is not a part of the lead containing glass frit.

The inclusion of the tellurium oxide additive greatly improves contact with the semiconductor emitter, and reduces the serial resistance. Tellurium oxide as an additive performs a totally different thermal dynamic reaction on a silicon wafer comparing to lead containing tellurite glass, compounds or composition. Tellurium oxide has high reactivity with silicon. The reaction between $TeO_2$ and Si has a Gibbs free energy change at 1000 K of $\Delta G=-140.949$ Kcal/mol. The reaction between PbO and Si has a $\Delta G=-59.249$ Kcal/mol. For Pb—Te—O glass, the $\Delta G$ should be even smaller. PbO and Pb—Te—O solids have a smaller $\Delta G$ than tellurium oxide, which suggests lower reactivity with silicon. (Thermodynamic stability of binary oxides in contact with silicon, K. J. Hubbard and D. G. Schlom, *J. Mater. Res.*, Vol. 11, No. 11, (1996)). It is believed that high reactivity with the silicon wafer could result in the formation of reactive contact points on the silicon wafer. The high reactivity of tellurium oxide may also contribute to formation of contact on certain high efficiency wafers with low surface doping concentration. Also, with tellurium oxide as an additive, the IRS system can be easily adapted to different glass frits and glass chemistries for a variety of electroconductive paste applications.

Incorporating tellurium oxide as an additive to the IRS also provides great flexibility to metallization paste formulation in industrial applications. Instead of making Pb—Te—O solids as glass frit and using such material in paste formulation, using tellurium oxide as an additive allows the paste reactivity to be easily adjusted to meet different Si-wafer (such as vary doping concentrations) and emitter structures.

The industrial trend for solar cell production is moving toward the fast firing process, with very fast belt speed and "Spike" firing profiles. The controllable high reactivity of the metallization paste according to the present invention with tellurium oxide additive is very suitable for such a process.

The tellurium oxide additive is between 5-95 wt. % of the IRS, more preferably between 10-60 wt. % of the IRS. In some embodiments, the tellurium oxide additive may comprise of submicron particles having a D50 less than 1 µm. In other embodiments, the tellurium oxide additive may be less than 10 µm in average particle size (D50).

The tellurium oxide additive is preferably tellurium dioxide ($TeO_2$), although tellurium trioxide ($TeO_3$) can also be used. In addition to tellurium oxides, other tellurium-oxygen compounds can be used, including, but not limited to, tellurious acid compound, telluric acid, organic telluric compounds, and any telluric compound that would produce telluride oxide during the firing process.

In a preferred embodiment, the lead containing composition is a type of glass frit (with an amorphous structure, and may also incorporate crystalline phases or compounds) having lead containing compounds as starting materials. The higher the amount of lead in the glass frit, the lower the glass transition temperature of the glass. However, higher lead amounts may also cause shunting in the semiconductor substrate, thereby decreasing the resulting solar cell's efficiency. In a preferred embodiment, lead oxide is used. More preferably, the glass frit contains about 35-95 wt. % lead oxide, preferably about 40-85 wt. % lead oxide.

The present invention IRS can have a PbO:Tellurium oxide additive weight percentage ratio of 95:5 to 5:95. Preferably, the PbO:Tellurium oxide additive weight percentage ratio is 10:1 to 1:10. More preferably, the PbO:Tellurium oxide additive weight percentage ratio is 5:1 to 1:5.

Glass frits of the present invention may also include other oxides or compounds known to one skilled in the art for making glass fits. For example, silicon, boron, aluminum, bismuth, lithium, sodium, magnesium, zinc, titanium, zirconium oxides and compounds. Other glass matrix formers or glass modifiers, such as germanium oxide, vanadium oxide, tungsten oxide, molybdenum oxides, niobium oxides, tin oxides, indium oxides, other alkaline and alkaline earth metal (such as K, Rb, Cs and Be, Ca, Sr, Ba) compounds, rare earth oxides (such as $La_2O_3$, cerium oxides), phosphorus oxides or metal phosphates, transition metal oxides (such as copper oxides and chromium oxides), metal halides (such as lead fluorides and zinc fluorides) may also be part of the glass composition.

Lead containing glass frit can be made by any process known to one skilled in the art. For example, glass frit components, in powder form, may be mixed together in a V-comb blender. The mixture is then heated to a very high temperature (around 120° C.) for about 30-40 minutes. The glass is then quenched, taking on a sand-like consistency. This coarse glass powder is then milled, such as in a ball mill or jet mill, until a fine powder results. Lead containing glass frit can alternatively comprise lead oxides, salts of lead halides, lead chalcogenides, lead carbonate, lead sulfate, lead phosphate, lead nitrate and organometallic lead compounds or compounds that can form lead oxides or salts during thermal decomposition. In another embodiment, lead oxide may be mixed directly with other components of the IRS of the present invention without the need of first processing the lead oxide into the form of a glass frit.

The IRS of the present invention may be created through any number of processes known to one skilled in the art. For example, the IRS particles, having an average particle size of around 0.1-10 µm (D50) are mixed from different raw IRS materials. The average particle size is dependent on the particle size of the raw IRS materials and the mixing process. A good mixing process should result in a well-dispersed mixture of the IRS components.

In another example, conventional solid state synthesis may be used to prepare the IRS. In this case, raw materials are sealed in a fused-quartz tube or tantalum or platinum tube under vacuum, and then heated to 700-1200° C. The materials dwell at this elevated temperature for 12-48 hours and then are slowly cooled (0.1° C./minute) to room temperature. In some cases, solid state reactions may be carried out in an alumina crucible in air.

In another example, co-precipitation may be used to form the IRS. In this process, the metal elements are reduced and co-precipitated with other metal oxides or hydroxides from a solution containing metal cations by adjusting the pH levels or by incorporating reducing agents. The precipitates of these metals, metal oxides or hydroxides are then dried and fired under vacuum at 400-600° C. and fine powders of the compounds are formed.

IRS according to the present invention may also comprise additional additives, which can be any oxides and compounds known to one skilled in the art to be useful as additives. For example, boron, aluminum, bismuth, lithium, sodium, magnesium, zinc, phosphate. Other glass matrix formers or glass modifiers, such as germanium oxide, vanadium oxide, tungsten oxide, molybdenum oxides, niobium oxides, tin oxides, indium oxides, other alkaline and alkaline earth metal (such as K, Rb, Cs and Be, Ca, Sr, Ba) compounds, rare earth oxides (such as $La_2O_3$, cerium oxides), phosphorus oxides or metal phosphates, transition metal oxides (such as copper oxides and chromium oxides), metal halides (such as lead fluorides and zinc fluorides) may also be used as additives to adjust glass properties such as glass transition temperature.

Another aspect of the present invention relates to an electroconductive paste composition which comprises metallic particles, the IRS of the present invention, and an organic vehicle. The preferred metallic particles are silver, but can be any known conductive metal or mixture thereof, including, but not limited to, gold, copper, or nickel. The metallic particles are about 50-95 wt. % of solid content of the paste, preferably about 75-95 wt. % of solid content of the paste. The IRS is about 1-10 wt. % of solid content of the paste, preferably about 2-8 wt. %, more preferably about 5% of solid content of the paste. The amount of tellurium oxide additive may also be measure based on weight percentage of paste. Typically the tellurium oxide additive can be of 0.1-5% wt. paste. More preferably, 0.3-5% wt. of paste.

The organic vehicle may comprise a binder and a solvent, as well as a surfactant and thixatropic agent. Typical compositions of the organic vehicle are known to those of skill in the art. For example, a common binder for such applications is a cellulose or phenolic resin, and common solvents can be any of carbitol, terpineol, hexyl carbitol, texanol, butyl carbitol, butyl carbitol acetate, or dimethyladipate or glycol ethers. The organic vehicle also includes surfactants and thixatropic agents known to one skilled in the art. Surfactants can include, but are not limited to, polyethyleneoxide, polyethyleneglycol, benzotriazole, poly(ethyleneglycol)acetic acid, lauric acid, oleic acid, capric acid, myristic acid, linolic acid, stearic acid, palmitic acid, stearate salts, palmitate salts, and mixtures thereof. The organic vehicle is about 1-20 wt. % of the paste, preferably about 5-15 wt. % of the paste. The thixatropic agent is about 0.1-5 wt. % of the paste.

To form an electroconductive paste, the IRS materials are combined with electroconductive particles, e.g., silver, and an organic vehicle using any method known in the art for preparing a paste composition. The method of preparation is not critical, as long as it results in a homogenously dispersed paste. The components can be mixed, such as with a mixer, then passed through a three roll mill, for example, to make a dispersed uniform paste. In addition to mixing all of the components together simultaneously, the raw IRS materials can be co-milled with silver particles in a ball mill for 2-24 hours to achieve a homogenous mixture of IRS and silver particles, which are then combined with the organic solvent in a mixer.

Such a paste may then be utilized to form a solar cell by applying the paste to the antireflection layer on the silicon substrate, such as by screen printing, and then drying and firing to form an electrode on the silicon substrate.

The preferred embodiments as described above of the present invention IRS system with a lead containing matrix forming composition and a tellurium oxide additive and electroconductive paste made thereof are typically applied to the light receiving surface of a silicon wafer. Typically, the present invention electroconductive paste is screen printed over the ARC of a silicon wafer. Other application methods, such us stenciling, may also be used to apply the electroconductive paste. However, the foregoing does not preclude incorporating the present invention IRS system to an electroconductive paste intended for the backside of the silicon wafer.

EXAMPLE 1

As shown in Table 1, exemplary electroconductive pastes T1-T4 were prepared with an IRS comprising a glass frit comprising about 43% PbO (in IRS) and a number of metal oxide additives. Particularly, exemplary electroconductive paste T1 comprises 1.5% wt. paste of bismuth oxide ($Bi_2O_3$), T2 comprises 1.5% wt. paste of tellurium oxide ($TeO_2$), T3 comprises 1.5% wt. paste of tin oxide (SnO), and T4 comprises 1.5% wt. paste of antimony trioxide ($Sb_2O_3$). Silver particles, in an amount of about 85 wt. % (of paste), and an organic vehicle, in an amount of about 1-10 wt. % (of paste), were added to form the exemplary pastes. Exemplary solar cells were prepared using lightly-doped p-type silicon wafers with a sheet resistance of 80 $\Omega/\square$.

TABLE 1

Metal oxide additives in electroconductive paste formulations

| IRS Components | | Reference paste | T1 | T2 | T3 | T4 |
|---|---|---|---|---|---|---|
| Leaded Glass Frit | Glass A (43% PbO) | 4.6 | 3.1 | 3.1 | 3.1 | 3.1 |
| Oxide Additives | $Bi_2O_3$ | | 1.5 | | | |
| | $TeO_2$ | | | 1.5 | | |
| | SnO | | | | 1.5 | |
| | $Sb_2O_3$ | | | | | 1.5 |
| Total IRS % in paste | | 4.60 | 4.60 | 4.60 | 4.60 | 4.60 |
| PbO w. % in IRS | | | 43.48% | 43.48% | 43.48% | 43.48% |

The paste was screen printed onto the front side of silicon wafers at a speed of 150 mm/s, using a 325 (mesh)*0.9 (mil, wire diameter)*0.6 (mil, emulsion thickness)*70 µm (finger line opening) calendar screen. An aluminum back side paste was also applied to the back side of the silicon wafer. The printed wafer was dried at 150° C. and then fired at a profile with the peak temperature of about 750-900° C. for a few seconds in a linear multi-zone infrared furnace. A commercial paste is used as reference.

All solar cells were then tested using an I-V tester. A Xe arc lamp in the I-V tester was used to simulate sunlight with a known intensity and the front surface of the solar cell was irradiated to generate the I-V curve. Using this curve, various parameters common to this measurement method which provide for electrical performance comparison were determined, including solar cell efficiency (Eta %), series resistance under three standard lighting intensities (Rs3 mΩ), fill factor (FF %). Direct measurement of contact resistance by four-probe technique is always used by researchers, but the measurement accuracy is very dependent on sample preparation. Therefore, in the circumstance when the finger line resistivity (usually the same silver material and firing condition) and finger line geometry (printing related) are identical, series resistance Rs3 given by H.A.L.M IV tester can be used to evaluate the electrical contact behavior of the conductive paste to silicon substrate. Generally, the smaller the Rs3, the better contact behavior of the silver pastes. Data for the reference paste was normalized to 1. The relevant data for the experimental pastes was calculated by dividing the appropriate measurement by the normalized reference cell data. Selected electrical performance data for exemplary pastes T1-T4 is compiled in Table 2.

It is clear from the data presented in Table 2 that exemplary paste T2 with tellurium oxide additive unexpectedly improves serial resistance, as shown through significant reduction of the Rs3 measurement, which also results in increased solar cell efficiency and fill factor gain. Other tested metal oxides failed to show similar beneficial effects, even though these metal oxides are also known to modify glass softening temperature and adjust glass flowability.

TABLE 2

Electric performance of solar cell produced using electroconductive paste formulations comprising metal oxide additives

| | Reference paste | T1 | T2 | T3 | T4 |
|---|---|---|---|---|---|
| Eta | 1.0000 | 1.0006 | 1.0077 | 1.0036 | 0.8349 |
| FF | 1.0000 | 1.0052 | 1.0081 | 1.0040 | 0.8366 |
| Rs3 | 1.0000 | 0.9771 | 0.9462 | 1.0548 | 4.9133 |

EXAMPLE 2

A number of additional exemplary pastes E1-E22 were prepared with four glass frits A (43% PbO), B (60% PbO), C (67% PbO), D (73% PbO) and various amounts of tellurium oxide additive. Details of the exemplary paste formulations and PBO and $TeO_2$ content and weight ratio of each exemplary paste is represented in Table 3. Exemplary solar cells, using mono-crystalline or polycrystalline silicon wafers with varying sheet resistance, were prepared by the process set forth in Example 1 above. More specifically, selected electrical performance data of solar cells prepared with multi-crystalline silicon wafer type 1A (sheet resistance of 70Ω/$\square$) is present in Table 4, electrical performance data of solar cells prepared with multi-crystalline silicon wafer 1B (sheet resistance of 95Ω/$\square$ is present in Table 5, electrical performance data of solar cells prepared with mono-crystalline silicon wafer type 2 (sheet resistance of 65Ω/□ is present in Table 6, electrical performance data of solar cells prepared with mono-crystalline silicon wafer type 3 (sheet resistance of 90Ω/□) is present in Table 7, electrical performance data of solar cells prepared with multi-crystalline silicon wafer type 4 (sheet resistance of 60Ω/□ is present in Table 8, electrical performance data of solar cells prepared with mono-crystalline silicon wafer type 5 (sheet resistance of 60Ω/□ is present in Table 9, electrical performance data of solar cells prepared with multi-crystalline silicon wafer type 6 (sheet resistance of 70Ω/□ is present in Table 10, electrical performance data of solar cells prepared with mono-crystalline silicon wafer type 7 (sheet resistance of 70Ω/□ is present in Table 11, and electrical performance data of solar cells prepared with multi-crystalline silicon wafer type 8 (sheet resistance of 65Ω/□ is present in Table 12. All data are normalized against reference paste on silicon wafer type 1A. Particularly, relative efficiency, relative fill factor, and relative Rs3 measurements for all exemplary pastes E1-E22 on all other silicon wafer types are normalized against efficiency, fill factor, and Rs3 measurements of reference paste on silicon wafer type 1A, respectively.

TABLE 4

Electric performance of solar cell produced using electroconductive paste formulations comprising tellurium oxide additive on silicon wafer type 1A

|  | Reference paste | E1 | E19 | E20 | E21 | E22 |
|---|---|---|---|---|---|---|
| Eta | 1.0000 | 1.0056 | 1.0134 | 1.0202 | 1.0212 | 1.0111 |
| FF | 1.0000 | 1.0131 | 1.0144 | 1.0137 | 1.0189 | 1.0132 |
| Rs3 | 1.0000 | 0.7963 | 0.6804 | 0.6748 | 0.8198 | 0.8076 |

TABLE 5

Electric performance of solar cell produced using electroconductive paste formulations comprising tellurium oxide additive on silicon wafer type 1B

|  | Reference paste | E16 | E17 |
|---|---|---|---|
| Eta | 1.0053 | 1.0201 | 1.0272 |
| FF | 0.9808 | 0.9973 | 1.0032 |
| Rs3 | 1.4524 | 0.8204 | 0.7654 |

TABLE 3

IRS formulations with tellurium oxide additive (Component wt. % in Paste)

| IRS Components | IRS Components | Reference paste | E1 | E2 | E3 | E4 | E5 | E6 | E7 | E8 | E9 | E10 |
|---|---|---|---|---|---|---|---|---|---|---|---|---|
| Leaded Glass Frit | Glass A (43% PbO) | 4.6 | 3.1 | 2.9 | 2.7 | | | | | | | |
| | Glass B (60% PbO) | | | | | 2.09 | | | | | | |
| | Glass C (67% PbO) | | | | | | 3.1 | 3.1 | 3.1 | 2.79 | 2.48 | 2.79 |
| | Glass D (73% PbO) | | | | | | | | | | | |
| TeO₂ (wt. % paste) | | | 1.5 | 1.5 | 1.5 | 2.51 | 1.5 | 1.2 | 1 | 0.7 | 0.8 | 0.9 |
| Total IRS (wt. % paste) | | 4.6 | 4.6 | 4.4 | 4.2 | 4.6 | 4.6 | 4.3 | 4.1 | 3.49 | 3.28 | 3.69 |
| PbO w. % in IRS | | 43.48% | 43.73% | 45.72% | 47.89% | 26.88% | 45.00% | 48.14% | 50.49% | 53.38% | 50.49% | 50.49% |
| TeO₂ w. % in IRS | | — | 32.61% | 34.09% | 35.71% | 54.57% | 32.61% | 27.91% | 24.39% | 20.06% | 24.39% | 24.39% |
| PbO/TeO₂ ratio, weight | | — | 0.90 | 0.88 | 0.86 | 0.22 | 0.93 | 1.24 | 1.57 | 2.13 | 1.57 | 1.57 |
| IRS Components | IRS Components | E11 | E12 | E13 | E14 | E15 | E16 | E17 | E18 | E19 | E20 | E21 | E22 |
| Leaded Glass Frit | Glass A (43% PbO) | | | | | | | | | | | | |
| | Glass B (60% PbO) | | | | | | | | | | | | |
| | Glass C (67% PbO) | 2.79 | 3.1 | 2.66 | 2.48 | 2.61 | 2.03 | 2.17 | 1.96 | | | | |
| | Glass D (73% PbO) | | | | | | | | | 3.2 | 2.7 | 2.2 | 1.7 |
| TeO₂ (wt. % paste) | | 0.6 | 0.5 | 0.9 | 0.6 | 0.9 | 0.5 | 0.7 | 0.7 | 1 | 1 | 1 | 1 |
| Total IRS (wt. % paste) | | 3.39 | 3.6 | 3.555 | 3.08 | 3.51 | 2.53 | 2.87 | 2.66 | 4.2 | 3.7 | 3.2 | 2.7 |
| PbO (wt. % in IRS) | | 54.96% | 57.50% | 52.41% | 53.77% | 53.08% | 57.27% | 50.49% | 54.47% | 55.24% | 50.16% | 43.50% | 34.37% |
| TeO₂ (wt. % in IRS) | | 17.70% | 13.89% | 25.32% | 19.48% | 25.64% | 19.76% | 24.39% | 26.32% | 23.81% | 27.03% | 31.25% | 37.04% |
| PbO/TeO₂ ratio, weight | | 2.56 | 3.57 | 1.55 | 2.22 | 1.54 | 2.33 | 1.57 | 1.53 | 1.77 | 1.35 | 0.96 | 0.58 |

TABLE 6

Electric performance of solar cell produced using electroconductive paste formulations comprising tellurium oxide additive on silicon wafer type 2

|     | Reference paste | E1 | E2 | E3 | E4 |
|-----|-----------------|------|------|------|------|
| Eta | 1.0378 | 1.0809 | 1.0856 | 1.0773 | 1.0773 |
| FF  | 0.9912 | 1.0242 | 1.0279 | 1.0119 | 0.9901 |
| Rs3 | 0.9526 | 0.4839 | 0.4938 | 0.6154 | 0.8897 |

TABLE 7

Electric performance of solar cell produced using electroconductive paste formulations comprising tellurium oxide additive on silicon wafer type 3

|     | Reference paste | E1 | E2 |
|-----|-----------------|--------|--------|
| Eta | 0.8040 | 1.1063 | 0.9976 |
| FF  | 0.7360 | 1.0130 | 0.9105 |
| Rs3 | 4.1267 | 0.6909 | 1.9430 |

TABLE 8

Electric performance of solar cell produced using electroconductive paste formulations comprising tellurium oxide additive on silicon wafer type 4

|     | Reference paste | E10 | E11 | E12 | E13 | E14 | E15 |
|-----|-----------------|------|------|------|------|------|------|
| Eta | 0.9787 | 0.9876 | 0.9900 | 0.9911 | 0.9841 | 0.9900 | 0.9876 |
| FF  | 0.9926 | 1.0097 | 1.0091 | 0.9966 | 1.0087 | 1.0083 | 1.0099 |
| Rs3 | 0.7915 | 0.6491 | 0.6647 | 0.8200 | 0.6847 | 0.6676 | 0.6636 |

TABLE 9

Electric performance of solar cell produced using electroconductive paste formulations comprising tellurium oxide additive on silicon wafer type 5

|     | Reference paste | E5 | E6 | E7 | E8 | E10 | E15 |
|-----|-----------------|------|------|------|------|------|------|
| Eta | 0.9669 | 0.9805 | 0.9876 | 0.9876 | 0.9852 | 0.9935 | 0.9935 |
| FF  | 0.9917 | 1.0097 | 1.0105 | 1.0117 | 1.0092 | 1.0097 | 1.0099 |
| Rs3 | 1.0455 | 0.6733 | 0.6488 | 0.6597 | 0.6985 | 0.6491 | 0.6636 |

TABLE 10

Electric performance of solar cell produced using electroconductive paste formulations comprising tellurium oxide additive on silicon wafer type 6

|     | Reference paste | E5 | E6 | E7 | E8 | E9 |
|-----|-----------------|------|------|------|------|------|
| Eta | 0.9693 | 0.9829 | 0.9882 | 0.9947 | 0.9953 | 0.9811 |
| FF  | 0.9900 | 1.0157 | 1.0154 | 1.0156 | 1.0174 | 1.0140 |
| Rs3 | 1.1562 | 0.5718 | 0.5524 | 0.5713 | 0.5595 | 0.5728 |

TABLE 11

Electric performance of solar cell produced using electroconductive paste formulations comprising tellurium oxide additive on silicon wafer type 7

|     | Reference paste | E16 | E17 | E18 |
|-----|-----------------|--------|--------|--------|
| Eta | 1.0915 | 1.1175 | 1.1163 | 1.1151 |
| FF  | 1.0144 | 1.0329 | 1.0345 | 1.0333 |
| Rs3 | 0.7726 | 0.5379 | 0.5366 | 0.5337 |

TABLE 12

Electric performance of solar cell produced using electroconductive paste formulations comprising tellurium oxide additive on silicon wafer type 8

|     | Reference paste | E11 | E16 |
|-----|-----------------|--------|--------|
| Eta | 0.9658 | 0.9752 | 0.9929 |
| FF  | 0.9689 | 0.9946 | 0.9987 |
| Rs3 | 1.1484 | 0.8387 | 0.9133 |

As shown in Tables 4-12, exemplary pastes E1-E22 are shown to produce solar cells with overall improved serial resistance as evidenced by the Rs3 measurements. The improvement in serial resistance also contributes to improved overall solar cell performance. For all types of silicon wafers tested, the exemplary pastes outperform the reference paste in terms of relative efficiency and/or fill factor. The most dramatic improvement over the commercial reference paste is shown through exemplary pastes comprising tellurium oxide additives according to the present invention with high sheet resistance silicon wafers, e.g., type 3 wafer (mono-crystalline with 90Ω/□ of sheet resistance). The reference paste performed poorly with this type of silicon wafer, providing poor serial resistance and overall subpar solar cell performance. The exemplary pastes E1 and E2, comprising the same type of PbO containing glass frit as the reference paste, showed drastically improved performance over the reference paste, providing very good serial resistance measurements and superior solar cell overall performance.

The electrical performance data for the reference paste shown in Table 4-12 also clearly demonstrates one persisting difficulty for the metallization paste technology. The same reference paste, applied using exactly the same screen printing and firing procedure on a number of silicon wafers of varying sheet resistance, produced solar cells of disparaging performance characteristics. For example, the relevant efficiency of the cells for the reference paste in Table 4-12 is from 0.8040 to 1.0915, which is a difference of over 28%. As an industrial process, such large variance is not acceptable. Paste composition thus must to be modified for each type of silicon wafer to achieve optimal performance of the resulting solar cells. The modification process is typically time-consuming, since an electroconductive paste comprises a number of components, allow of which may need to be optimized.

The present invention incorporates a tellurium oxide additive. As an additive, and not part of the matrix forming composition, the amount of the tellurium oxide additive can be readily adjusted for different types of silicon wafer. It is believed that reactivity of the IRS system can be fine-tuned by adjusting the tellurium oxide additive. The data presented in Table 4-12 shows that by adjusting lead containing matrix forming compositions and tellurium oxide additive, optimal performance can be expected from all the tested silicon wafers. For exemplary pastes E1-E22, types and amounts of lead containing glass frit and amounts of tellurium oxide are adjusted. As shown above, the resulting solar cells outperform the reference paste in terms of relative efficiency and/or fill factor (Table 4-12). This is particularly true for silicon wafers where the reference paste fails to perform (Table 7).

These and other advantages of the present invention will be apparent to those skilled in the art from the foregoing specification. Accordingly, it will be recognized by those skilled in the art that changes or modifications may be made to the above described embodiments without departing from the broad inventive concepts of the invention. Specific dimensions of any particular embodiment are described for illustration purposes only. It should therefore be understood that this invention is not limited to the particular embodiments described herein, but is intended to include all changes and modifications that are within the scope and spirit of the invention.

What is claimed is:

1. An electroconductive paste composition comprising:
   metallic particles;
   an inorganic reaction system comprising a lead containing matrix forming composition and a tellurium oxide additive, wherein the lead containing composition is between 5-95 wt. % of the inorganic reaction system, and the tellurium oxide additive is between 5-95 wt. % of the inorganic reaction system; and
   an organic vehicle.

2. The electroconductive paste as in claim 1, wherein the metallic particles are at least one of silver, gold, copper, and nickel.

3. The electroconductive paste as in claim 1, wherein the metallic particles are silver.

4. The electroconductive paste as in claim 1, wherein the metallic particles are about 50-95 wt. % of solid content of the paste.

5. The electroconductive paste as in claim 1, wherein the organic vehicle comprises a binder, a surfactant, an organic solvent, and a thixatropic agent.

6. A method of producing a solar cell comprising the steps of:
   a. providing a silicon wafer;
   b. applying an electroconductive paste according to claim 1 to the silicon wafer;
   c. firing the silicon wafer according to an appropriate profile.

7. The method of producing a solar cell according claim 6, wherein the silicon wafer comprising an antireflective coating.

8. The method of producing a solar cell according claim 6, wherein the electroconductive paste is applied to a light receiving surface of the silicon wafer.

9. The electroconductive paste composition of claim 1, wherein the lead containing matrix forming composition is between 10-90 wt. % of the inorganic reaction system, and the tellurium oxide additive is between 10-60 wt. % of the inorganic reaction system.

10. The electroconductive paste composition of claim 1, wherein the tellurium oxide additive comprises one or more of tellurium dioxide, tellurium trioxide, and any tellurium compound that would convert to tellurium oxide at temperature 200-1000° C.

11. The electroconductive paste composition of claim 1, wherein the tellurium oxide additive is of an average particle size of less than 10 µm.

12. The electroconductive paste composition of claim 1, wherein the tellurium oxide additive is of an average particle size of less than 1 µm.

13. The electroconductive paste composition of claim 1, wherein the lead containing matrix forming composition is a glass frit.

14. The electroconductive paste composition of claim 1, wherein the lead containing matrix forming composition comprises lead oxide.

15. The electroconductive paste composition of claim 1, wherein the lead containing matrix forming composition comprises between about 10-90 wt. % lead oxide.

16. The electroconductive paste composition of claim 1, wherein the lead containing matrix forming composition comprises between about 5-45 wt. % lead oxide.

17. The electroconductive paste composition of claim 1, wherein the inorganic reaction system has a PbO:Tellurium oxide additive weight percentage ratio of 95:5 to 5:95.

18. The electroconductive paste composition of claim 13, wherein the glass frit comprises an amorphous structure.

19. The electroconductive paste composition of claim 13, wherein the glass frit comprises crystalline phases or compounds.

20. The electroconductive paste composition of claim 1, wherein the inorganic reaction system has a PbO:Tellurium oxide additive weight percentage ratio of 10:1 to 1:10.

21. The electroconductive paste composition of claim 1, wherein the inorganic reaction system has a PbO:Tellurium oxide additive weight percentage ratio of 5:1 to 1:5.

* * * * *